(12) United States Patent
Seto (10) Patent No.: US 6,407,397 B1
(45) Date of Patent: Jun. 18, 2002

(54) CHARGED PARTICLE BEAM EXPOSURE APPARATUS

(75) Inventor: Isamu Seto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/339,685

(22) Filed: Jun. 24, 1999

(30) Foreign Application Priority Data

Jul. 2, 1998 (JP) .......................................... 10-187581

(51) Int. Cl.$^7$ .............................................. H01J 37/304
(52) U.S. Cl. .............................. 250/492.22; 250/492.21
(58) Field of Search ........................ 256/492.22, 396 R, 256/397, 398, 400, 492.1

(56) References Cited

U.S. PATENT DOCUMENTS

| | | | |
|---|---|---|---|
| 5,384,463 A | * 1/1995 | Honjo | 250/398 |
| 5,528,048 A | 6/1996 | Oae et al. | 250/492.22 |
| 5,614,725 A | 3/1997 | Oae et al. | 250/492.22 |
| 5,757,015 A | 5/1998 | Takemoto et al. | 250/491.1 |
| 6,118,129 A | * 9/2000 | Oae | 250/492.22 |
| 6,137,111 A | * 10/2000 | Yamada et al. | 250/492.2 |

FOREIGN PATENT DOCUMENTS

| | | |
|---|---|---|
| DE | 199 22 545 A | 11/1999 |
| EP | 0 066 404 | 12/1982 |
| EP | 0 736 893 | 10/1996 |
| GB | 2 337 359 A | 11/1999 |

* cited by examiner

Primary Examiner—Bruce Anderson
Assistant Examiner—Anthony Quash
(74) Attorney, Agent, or Firm—Christie, Parker & Hale, LLP (57) ABSTRACT

Pattern data correction controllers $64_i$ are provided one for each column, correction operation processing is performed on exposure data according to the characteristics of each corresponding column, the operation processing time corresponding to the exposure processing cycle required in the corresponding column is computed from data $SD_1$, $SCD_1$, $WDM_1$, $WDS_1$ indicating a per-shot exposure time, exposure time correction value, and settling waiting time generated based on the correction operation processing, a maximum value is detected from among the operation processing times computed by the respective pattern data correction controllers and, based on data PCD representing the operation processing time of the maximum value thus detected, an operation processing clock CK is generated and supplied to correction operation processing blocks 72 to 74 in the respective pattern data correction controllers.

4 Claims, 4 Drawing Sheets

CHARGED PARTICLE BEAM EXPOSURE APPARATUS

BACKGROUND OF THE INVENTION

1. Field of the Invention

The present invention relates to an exposure apparatus using a charged particle beam such as an electron beam, and more particularly to a multi-column electron beam exposure apparatus having a plurality of columns, each containing deflection/scanning means for deflecting and scanning an electron beam across a workpiece (specifically a wafer), and writing a pattern on the wafer by appropriately operating the deflection/scanning means in accordance with exposure pattern data.

2. Description of the Related Art

In recent years, with the increasing density of integrated circuits, exposure methods using charged particle beams such as an electron beam or an ion beam or novel exposure methods using X-rays have been studied and are beginning to be commercially implemented to replace photolithography which has long been the predominant technique for the formation of fine feature patterns. Among these methods, electron beam exposure, which forms a pattern using an electron beam, has the advantageous characteristic that it can focus the electron beam down to a spot of several tens of nanometers, making it possible to form a fine pattern of 1 $\mu$m or less. However, since the exposure using an electron beam is a "single-stroke" writing method, the exposing beam size must be made smaller as the feature size becomes smaller, with the result that the exposure time becomes prohibitively long. To resolve such a deficiency, a block exposure method has been devised and put to practical use.

The block exposure method is one that uses a block mask with openings formed therein corresponding to some of basic patterns which serve as units of repetitive patterns, and that passes a beam through a desired opening, thereby generating unit patterns at a time for writing on the workpiece, the patterns thus written being connected to accomplish the exposure of repetitive patterns. This block exposure method is therefore extremely effective for pattern exposure for 1-Gb (gigabit) DRAMs or 4-Gb DRAMs where most of the fine featured area for exposure consists of the repetition of certain basic patterns.

However, since the conventional known technique is based on the use of a system that controls a single column, the idea of controlling a system equipped with multiple columns (a multi-column electron beam exposure apparatus) has not been embodied yet.

It has also been found that if a multi-column electron beam exposure apparatus were to be realized, various problems would arise. For example, when fabricating a multi-column electron beam exposure apparatus, the columns must be manufactured so that they are as identical to each other as possible, but in reality, there occur variations among the columns in the characteristics of the electrostatic lenses, coils, stages, etc. due to manufacturing variations and other factors. More specifically, the per-shot exposure time and per-shot settling waiting time vary from column to column because of such factors as the amount of the electron beam, mounting conditions of deflectors, wafer warp age, etc. That is, the exposure processing time varies because of inherent variations among the columns. In the description hereinafter given, the term "exposure processing time" refers to the sum of the per-shot exposure time and the waiting time (blanking time) required for the deflectors, etc. to settle to be ready for the next shot.

When there are such variations among the columns, if exposure data is supplied from a common controller at the same timing to the respective columns for the exposure of the same pattern in each column, time variation may occur from column to column, causing a failure to accomplish proper exposure. This results in reduced throughput, contrary to the purpose Of improving the throughput for which the multi-column electron beam exposure is intended.

SUMMARY OF THE INVENTION

The present invention has been devised in view of the problem with the conventional art, and an object of the invention is to provide a charged particle beam exposure apparatus that can achieve proper exposure by achieving perfect synchronization of control between multiple columns and can thus contribute to improving throughput.

To attain the above object, the charged particle beam exposure apparatus according to the present invention is equipped with a plurality of columns, each containing deflection/scanning means for deflecting and scanning a charged particle beam across a sample for exposure, and writing a pattern on the sample by appropriately operating the deflection/scanning means in accordance with exposure pattern data, and comprises: a clock generator for generating an operation processing clock with which the entire charged particle beam exposure apparatus is operated; pattern data correction controllers, one for each column, each controller having a correction operation processing block for performing correction operation processing on the exposure pattern data according to the characteristics of its corresponding column in response to the operation processing clock and for supplying the resulting correction data to the deflection/scanning means contained in the corresponding column, and a data processing block for computing an operation processing time corresponding to an exposure processing cycle, required in the corresponding column, from data indicating a per-shot exposure time, settling waiting time, and exposure time correction value generated based on the correction operation processing; and a maximum value detector for detecting a maximum value from among the operation processing times computed by the data processing blocks in the respective pattern data correction controllers, and wherein the clock generator generates the operation processing clock based on the operation processing time of the maximum value detected by the maximum value detector.

According to the configuration of the charged particle beam exposure apparatus of the present invention, the pattern data correction controller provided for each column performs correction operation processing on the exposure data according to the characteristics of the corresponding column and, based on the correction operation processing, computes the operation processing time corresponding to the exposure processing cycle required in that column; next, the maximum value detector detects the maximum value from among the operation processing times computed by the respective pattern data correction controllers, and the clock generator generates the operation processing clock based on the operation processing time of the maximum value thus detected. The generated operation processing clock is supplied to the correction operation processing blocks in the respective pattern data correction controllers. That is, the correction operation processing blocks corresponding to the respective columns operate in unison by responding to the common operation processing clock. This operation processing clock corresponds to the longest operation processing time of all the operation processing times corresponding to the exposure processing cycle required in the respective columns, that is, the exposure processing time of the column that requires the longest time for exposure processing.

Accordingly, even if there is a variation in the exposure processing time due to manufacturing variations among the columns, the operation processing clock generated by the clock generator is supplied with the same timing (that is, synchronized to the exposure cycle of the column that requires the longest time for exposure processing) to the correction operation processing blocks corresponding to the respective columns. This achieves perfect synchronization of control between the respective columns, making it possible to project the same pattern for exposure simultaneously in all the columns. As a result, proper exposure can be achieved in all the columns, and throughput can thus be improved.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figures.

Figure 1:
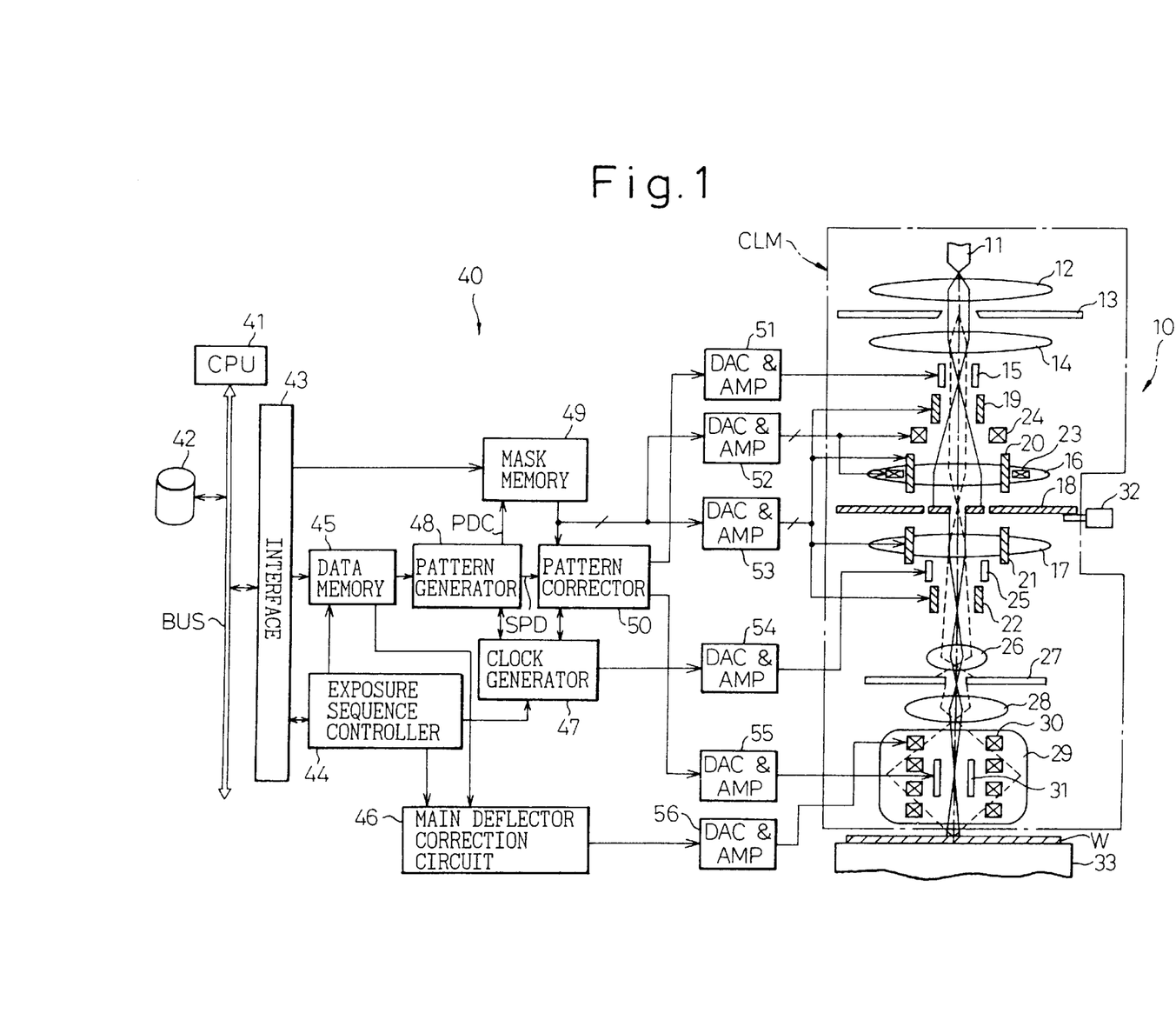
FIG. 1 is a diagram showing, partly in schematic form, a typical configuration example of an electron beam exposure apparatus which employs a block exposure method.

FIG. 1 is a diagram showing, partly in schematic form, a typical configuration example of an electron beam exposure apparatus which employs a block exposure method.

As shown, the electron beam exposure apparatus comprises an exposure section 10 and a control section 40. In the exposure section 10, the portion CLM enclosed by semi-dashed lines is called a "column". In the column CLM, reference numeral 11 is an electron gun which emits an electron beam; 12 is a lens for forming the emitted electron beam into a parallel beam; 13 is a mask having an aperture for shaping the electron beam into a rectangle in cross section; 14 is a lens for converging the shaped electron beam; 15 is a deflector for deflecting the shaped electron beam illuminating a block mask (indicated at 18 described hereinafter); 16 and 17 are lenses arranged opposite each other and one above the other in the direction of the electron beam flow; 18 is the block mask mounted movably in horizontal directions between the lenses 16 and 17 and having openings (transmission patterns) formed therein for shaping the electron beam into a desired cross-sectional shape; 19 to 22 are mask deflectors for deflecting the electron beam on the block mask 18 to select the desired transmission pattern and for bringing the electron beam back toward the optical axis after it is passed through the desired transmission pattern; 23 and 24 are a dynamic focus coil and a dynamic stigmator coil, respectively, for correcting the deflection of the electron beam; 25 is a blanking deflector for blocking the electron beam or allowing it to pass through; 26 is a lens for reducing the electron beam in cross section; 27 is a mask having an aperture for shaping the electron beam into a circle in cross section; 28 and 29 are projection lenses for projecting the shaped electron beam onto the workpiece (wafer W described hereinafter); and 30 and 31 are a main deflector and a sub deflector, respectively, for positioning the electron beam on the wafer W.

Further, reference numeral 32 is a mask stage for holding the block mask 18 thereon and for moving it in horizontal directions, and 33 is a wafer stage movable in horizontal directions with the wafer W mounted thereon. Though not specifically shown here, the wafer stage 33 is contained in a chamber coupled to the column CLM with an appropriate vacuum level maintained therebetween, and is connected to a means (a laser interferometer or the like) for detecting the x-y coordinate position of the stage and also to a stage moving mechanism for moving the stage based on the result of the position detection.

On the other hand, in the control section 40, reference numeral 41 is a central processing unit (CPU) for controlling the entire operation of the electron beam exposure apparatus; 42 is a storage medium, connected to the CPU 41 via a system bus BUS, for storing design data, etc. of an integrated circuit device; 43 is an interface connected to the CPU 41 via the system bus BUS; 44 is an exposure sequence controller for controlling the general sequence of the exposure process based on the exposure start/end information transferred from the interface 43; 45 is a data memory for storing writing pattern data transferred from the interface 43, data concerning the block mask 18, etc., the output of the data being controlled by the exposure sequence controller 44; 46 is a main deflector correction circuit for performing processing, such as the computation of a deflection amount correction value for the main deflector 30, based on the main deflector deflection data from the data memory 45 under the control of the exposure sequence controller 44; 47 is a clock generator for generating, under the control of the exposure sequence controller 44, an operation processing clock for the operation of the entire exposure apparatus and a blanking clock, based on the per-shot exposure time data, exposure time correction data, and settling waiting time data supplied from the pattern generator and pattern corrector hereinafter described; 48 is the pattern generator, responsive to the operation processing clock from the clock generator 47, for specifying one of the transmission patterns on the block mask 18 based on the data stored in the data memory 45, and for performing processing such as the generation of mask illumination position data indicating the position of the specified pattern on the block mask 18 (i.e., pattern data code PDC indicating the transmission pattern to be used for projecting the desired writing pattern) and the generation of wafer exposure position data indicating the position on the wafer W at which the writing pattern is to be projected (i.e., shot pattern data SPD corresponding to beam radiation for one shot); 49 is a mask memory in which the relationship between the position of each pattern on the block mask 18 (the pattern data code PDC) and the corresponding deflection data, measured in advance, is stored (through the interface 43); 50 is the pattern corrector, responsive to the operation processing clock from the clock generator 47, for performing processing, such as the computation of the correction value appropriate to the difference between the shape of the writing pattern and the shape of the specified pattern, based on the deflection data from the mask memory 49 and the shot pattern data SPD from the pattern generator 48; 51 is a DAC& (hereinafter called the amplifier block for the sake of convenience) for converting the correction value supplied from the pattern corrector 50 into an analog value, and for supplying it as corrected deflection data to the deflector 15 after appropriately amplifying it; 52 and 53 are amplifier blocks for converting the deflection data supplied from the mask memory 49 into analog data, and for supplying it to the dynamic focus coil 23 and dynamic stigmator coil 24 and to the mask deflectors 19 to 22, respectively, after appropriately amplifying it; 54 is an amplifier block for converting the blanking clock supplied from the clock generator 47 into an analog signal, and for supplying it as a blanking signal to the blanking deflector 25 after appropriately amplifying it; and 55 and 56 are amplifier blocks for respectively converting the correction values supplied from the pattern corrector 50 and main deflector correction circuit 46 into analog values, and for supplying them as corrected deflection data to the sub deflector 31 and the main deflector 30, respectively, after appropriately amplifying them.

In the above configuration, the exposure process is carried out as follows.

First, data for exposure processing is read from the storage medium 42 by the CPU 41 and stored in the data memory 45. When the exposure process is started by applying an activation signal from the CPU 41 to the exposure sequence controller 44, first the main deflector deflection data stored in the data memory 45 is transferred to the main deflector correction circuit 46 for the computation of the correction value which is supplied, as the corrected deflection data, to the main deflector 30 via the amplifier block 56. Next, after the output value has stabilized, the exposure sequence controller 44 controls the clock generator 47 to generate the operation processing clock and blanking clock. In response to the operation processing clock, the pattern generator 48 reads the block data and pattern data stored in the data memory 45 and, based on the respective data, generates the pattern data code PDC and shot pattern data SPD. Next, the deflection data corresponding to the pattern data code PDC is read from the mask memory 49 and input to the pattern corrector 50. The pattern corrector 50, in response to the operation processing clock, performs processing to compute the correction value based on the thus input deflection data and the shot pattern data SPD input from the pattern generator 48. Then, the data output from the pattern corrector 50, the data read from the mask memory 49, and the blanking clock generated by the clock generator 47 are input to the respectively corresponding amplifier blocks 51 to 55 for conversion into analog form, and are then supplied to the respective deflectors or coils after being amplified appropriately.

On the other hand, the electron beam emitted from the electron gun 11 is formed into a parallel beam by the lens 12, passed through the rectangular aperture in the mask 13, and converged by the lenses 14 and 16 for projection on the block mask 18. The projected electron beam is appropriately deflected at the block mask 18. More specifically, deflection over a relatively large range (about 5 mm) at the block mask 18 is performed by the mask deflectors 19 and 20, and deflection over a relatively small range (about 500 $\mu$m), after the desired transmission pattern on the mask 18 has been selected by the first set of deflectors, is performed by the deflector 15. Next, the electron beam passed through the desired transmission pattern in the block mask 18 is brought back to the original optical axis by the mask deflectors 21 and 22 and, after the beam is converged by the lens 17, the beam deflection is corrected by the beam correction coils (the dynamic focus coil 23 and the dynamic stigmator coil 24); the electron beam is then passed through the blanking deflector 25, reduced in cross section by the lens 26, passed through the circular aperture in the mask 27, and projected through the projection lenses 28 and 29 onto the wafer W (for exposure). The electron beam projected on the wafer W is deflected by the main deflector 30 over a coarse deflection range of about 2 mm, and further deflected by the sub deflector 31 over a fine deflection range of about 100 $\mu$m. In this process, by turning on and off the electron beam by means of the blanking deflector 25, the pattern is written on the wafer W.

With increasing density of integrated circuits in recent years, the beam shot count has increased to 10 megashots per chip or 1 gigashot per wafer. Here, the beam shot frequency is about 10 MHz; even if this huge number of shots are repeated at high speed, there is a limit in increasing the throughput. In view of this, a higher operating speed is demanded of the control section that controls the column, and for the resist applied on the wafer for exposure, the need to develop a high-sensitivity resist is pressing.

An electron beam exposure apparatus has the advantage of being able to achieve higher resolution than is possible with a photolithography apparatus, but has, in turn, the disadvantage of lower throughput. The previously mentioned multi-column electron beam exposure apparatus is considered effective in increasing the throughput. In this case, simply increasing the number of columns is not sufficient to achieve the purpose, though it is effective in saving space compared with the case where a plurality of conventional single-column electron beam exposure apparatuses (for example, one such as shown in FIG. 1) are arranged in close proximity to each other. Therefore, an effective method will be to make the control section common to the plurality of columns so that the same pattern can be projected for exposure in all the columns.

Figure 2:
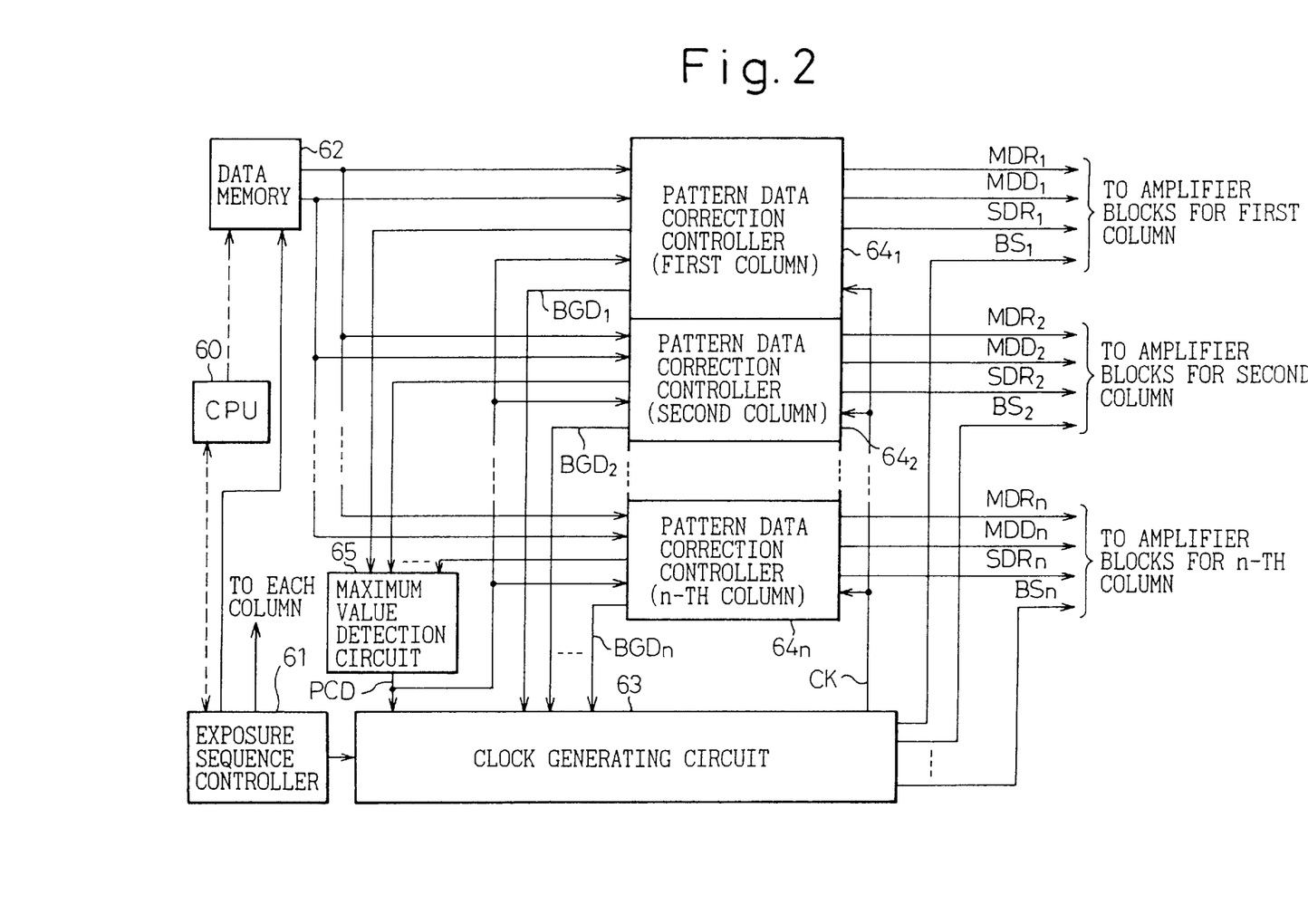
FIG. 2 is a block diagram showing, in simplified form, the configuration of a control section in a multi-column electron beam exposure apparatus according to one embodiment of the present invention.

FIG. 2 shows in simplified form the configuration of a control section in a multi-column electron beam exposure apparatus according to one embodiment of the present invention.

The multi-column electron beam exposure apparatus of this embodiment comprises n columns, each of which has the construction already explained with reference to FIG. 1 and, though not specifically shown here, is connected to a vacuum chamber containing a corresponding wafer stage. The vacuum chamber may be provided for each individual column or common to all the columns.

In the control section shown in FIG. 2, reference numeral 60 is a CPU for controlling the entire operation of the exposure apparatus, 61 is an exposure sequence controller for controlling the general sequence of the exposure process based on the exposure start/end information directed by the CPU 60, and 62 is a data memory for storing writing pattern data, data concerning the block mask, deflection data for the respective deflectors, etc., the output of the data being controlled by the exposure sequence controller 61.

Further, reference numeral 63 is a clock generating circuit which, under the control of the exposure sequence controller 61, generates an operation processing clock CK for the operation of the entire exposure apparatus and blanking signals $BS_1$ to $BS_n$ to the amplifier blocks for the blanking deflectors in the respective columns.

Reference numerals $64_1$ to $64_n$ are pattern data correction controllers provided one for each of the columns. Each pattern data correction controller $64_i$ (i=1 to n) operates in response to the operation processing clock CK under the control of the exposure sequence controller 61. More specifically, each pattern data correction controller $64_i$ performs correction operation processing on the data supplied from the data memory 62, according to the characteristics of the corresponding column and supplies the resulting correction data (main deflector deflection data $MDR_i$, mask deflector deflection data $MDD_i$, and sub deflector deflection data $SDR_i$) to the amplifier blocks for the respective deflectors contained in the corresponding column. The pattern data correction controller $64_i$, as will be described in detail later, also has the function of computing the operation processing time corresponding to the exposure processing cycle required in the corresponding column and generating data $BGD_i$ (hereinafter called the "blanking generation data") that indicates the blanking time (exposure shot settling waiting time) in the corresponding column.

Further, reference numeral 65 is a maximum value detection circuit for detecting the maximum value from among the operation processing times computed by the respective pattern data correction controllers $64_1$ to $64_n$, in which processing times correspond to the exposure processing cycle in the respective columns. The operation processing time of the maximum value detected by this circuit is supplied as operation processing cycle data PCD to the clock generating circuit 63 and, at the same time, is fed back to the respective pattern data correction controllers $64_1$ to $64_n$.

The clock generating circuit 63 generates the operation processing clock CK based on the operation processing cycle data PCD supplied from the maximum value detection circuit 65, and also generates the blanking signals $BS_1$ to $BS_n$, based on the blanking generation data $BGD_1$ to $BGD_n$, supplied from the respective pattern data correction controllers $64_1$ to $64_1$.

Figure 3:
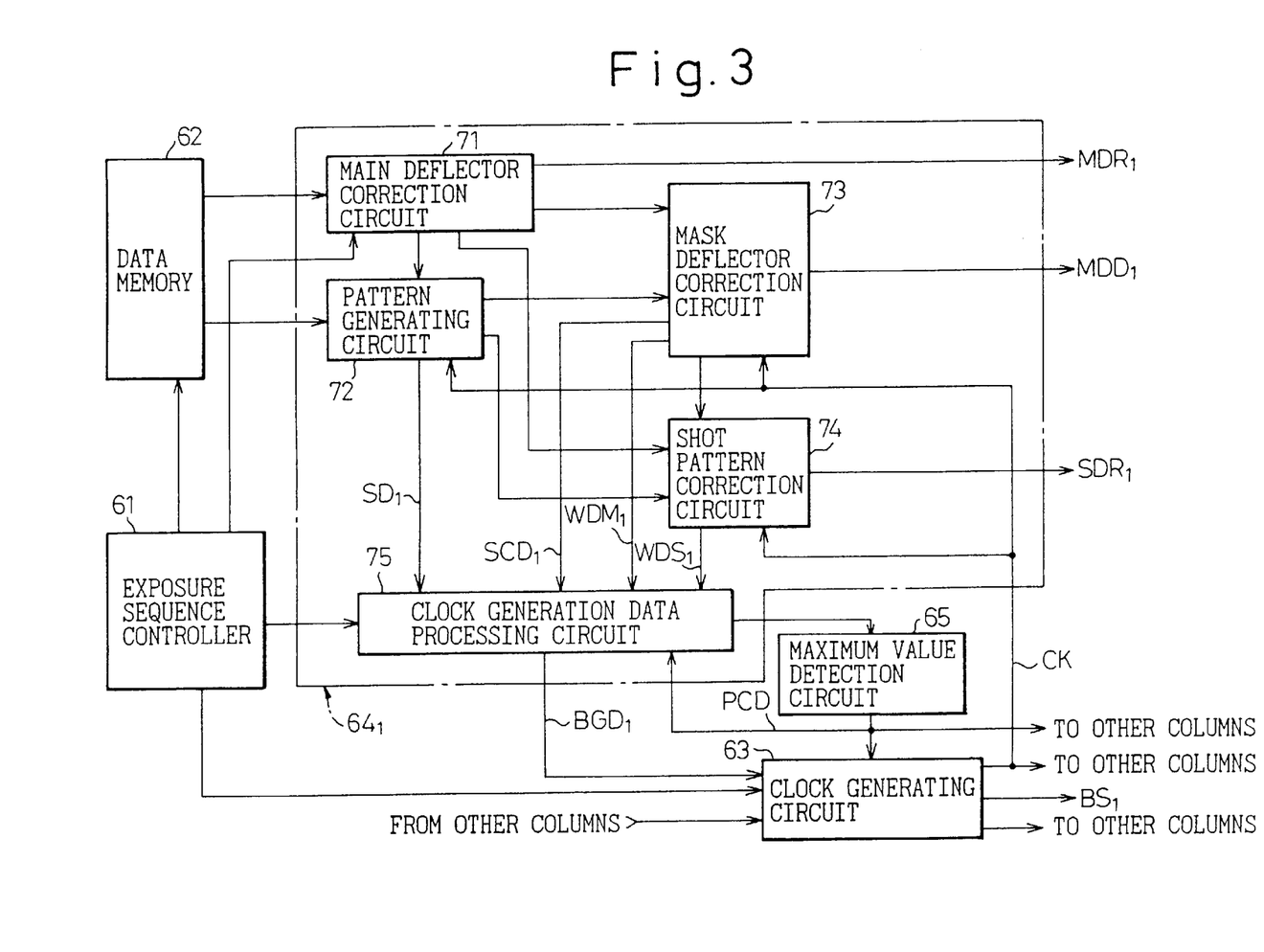
FIG. 3 is a block diagram showing the configuration of a pattern data correction controller for one column in FIG. 2.

FIG. 3 shows the configuration of the pattern data correction controller for one column.

The illustrated example (the portion enclosed by semi-dashed lines) shows the configuration of the pattern data correction controller $64_1$ corresponding to the first column, as a representative example. In the pattern data correction controller $64_1$, reference numeral 71 is a main deflector correction circuit which performs processing, such as the computation of the deflection data $MDR_1$ for the main deflector, based on the main deflector deflection data from the data memory 62 under the control of the exposure sequence controller 61; 72 is a pattern generating circuit which performs processing, such as the selection of a transmission pattern on the block mask (generation of pattern data code), disassembling to the shot data (generation of shot pattern data), and the selection of the shot time (generation of shot time data $SD_1$), based on the block data and pattern data supplied from the data memory 62; 73 is a mask deflector correction circuit which, based on the correction data supplied from the main deflector correction circuit 71 and the pattern data code from the pattern generating circuit 72, computes the deflection data $MDD_1$ for the mask deflector and generates shot time correction data $SCD_1$ and deflection settling waiting time data $WDM_1$; 74 is a shot pattern correction circuit which, based on the correction data supplied from the main deflector correction circuit 71 and the shot pattern data from the pattern generating circuit 72, computes the deflection data $SDR_1$ for the sub deflector and generates deflection settling waiting time data $WDS_1$; and 75 is a clock generation data processing circuit which computes the operation processing time corresponding to the exposure processing cycle required in the first column and generates the blanking generation data $BGD_1$, based on the shot time data $SD_1$, shot time correction data $SCD_1$, and deflection settling waiting time data $WDM_1$ and $WDS_1$ supplied from the correction operation processing block, and on the operation processing cycle data PCD output from the maximum value detection circuit 65.

Figure 4:
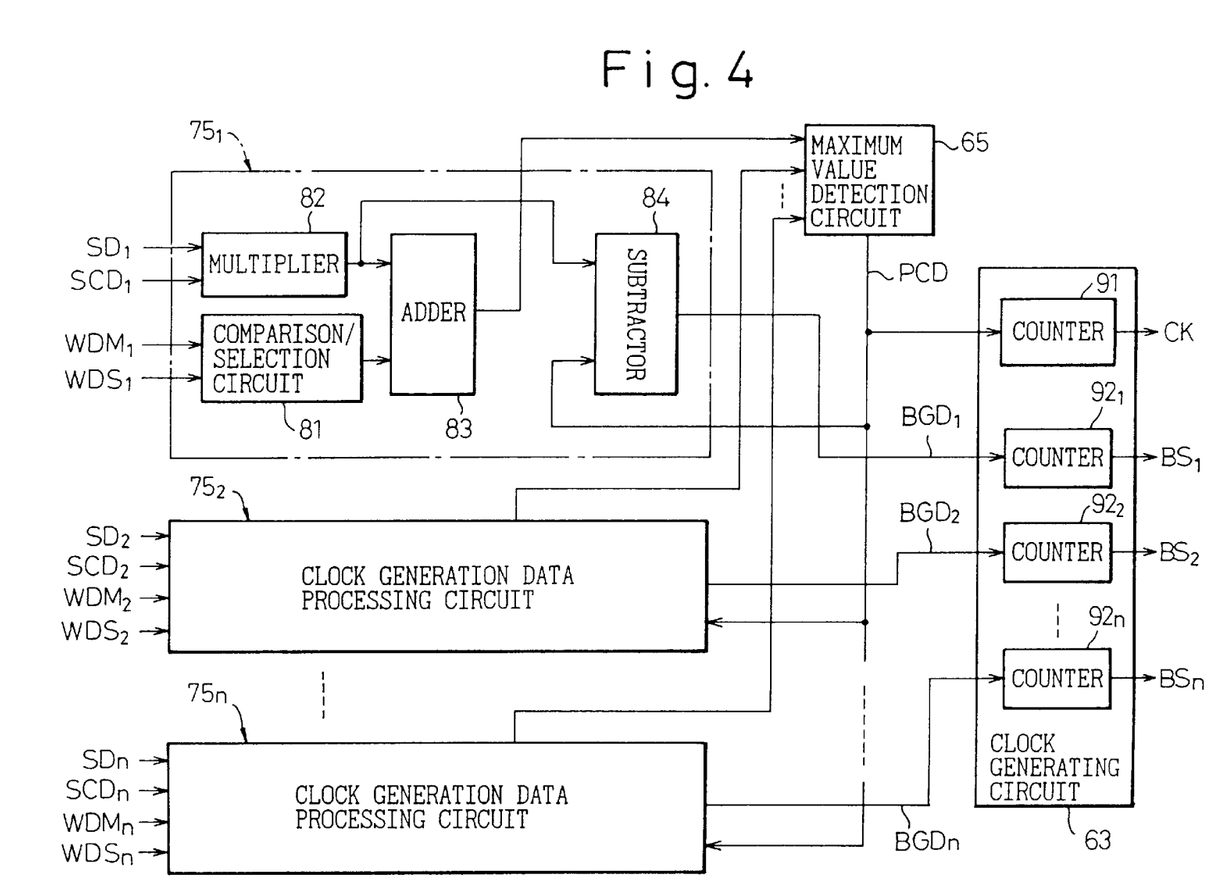
FIG. 4 is a block diagram showing the configuration of a clock generation data processing circuit and a clock generating circuit in FIG. 3.

FIG. 4 shows the configuration of the clock generation data processing circuits 75 ($75_1$ to $75_n$) and clock generating circuit 63. For the sake of simplicity, the circuit configuration only of the circuit corresponding to the first column is shown to represent the clock generation data processing circuits.

As shown, the clock generation data processing circuit $75_1$ includes: a comparison/selection circuit 81 which compares the two deflection settling waiting time data $WDM_1$ and $WDS_1$ by size and selects the data of the larger size for output; a multiplier circuit 82 which multiplies the shot time data $SD_1$ by the shot time correction data $SCD_1$; an adder circuit 83 which adds the output data of the multiplier circuit to the deflection settling waiting time data selected and output from the comparison/selection circuit 81; and a subtractor circuit 84 which subtracts the output data of the multiplier circuit 82 from the operation processing time (operation processing cycle data PCD) of the maximum value detected by the maximum value detection circuit 65. The same configuration applies to the clock generation data processing circuits for other columns.

The output data of the adder circuit 83 in each of the clock generation data processing circuits $75_1$ to $75_n$ is supplied to the maximum value detection circuit 65 as the data of the operation processing time corresponding to the exposure processing cycle for the corresponding column. The output data of the subtractor circuits 84 are supplied to the clock generating circuit 63 as the blanking generation data $BGD_n$ to $BGD_n$ indicating the blanking times for the respectively corresponding column on the other hand, the clock generating circuit 63 includes a counter 91 for generating the operation processing clock CK based on the operation processing cycle data PCD output from the maximum value detection circuit 65, and counters $92_1$ to $92_n$ for generating the blanking signals $BS_n$ to $BS_n$ indicating settling waiting times, based on the blanking generation data $BGD_n$ to $BGD_n$ output from the respective clock generation data processing circuits $75_1$ to $75_n$.

As described above, according to the configuration of the multi-column electron beam exposure apparatus of the present invention, each of the pattern data correction controllers $64_1$ to $64_n$, provided one for each column, performs correction operation processing on the exposure data according to the characteristics of the corresponding column and, based on this processing, computes the operation processing time corresponding to the exposure processing cycle required in the corresponding column; then, the maximum value detection circuit 65 detects the maximum value from among the operation processing times computed by the respective pattern data correction controllers $64_i$ and, based on the operation processing time (operation processing cycle data PCD) of the maximum value thus detected, the clock generating circuit 63 generates the operation processing clock CK. The operation processing clock CK is supplied to the correction operation processing block (consisting of the circuits shown at 72 to 74 in FIG. 3) in each pattern data correction controller $64_i$. That is, the correction operation processing blocks for the respective columns operate in unison by responding to the operation processing clock CK. As earlier described, the operation processing clock CK corresponds to the longest operation processing time of all the operation processing times corresponding to the exposure processing cycle required in the respective columns.

Accordingly, even if there is a variation in the exposure processing time due to manufacturing variations among the columns, the operation processing clock CK can be supplied with the same timing to the correction operation processing blocks for all the columns. This achieves perfect synchronization of control between the respective columns, making it possible to project the same pattern for exposure simultaneously in all the columns. As a result, proper exposure can be achieved in all the columns, and throughput can thus be improved.

The above embodiment has been described by taking the block exposure method as an example, but as is apparent from the purpose of the invention, it will be appreciated that the invention is equally applicable for other exposure methods such as a variable rectangular shape exposure method or a blanking aperture array (BAA) exposure method.

Further, the above embodiment has been described as using an electron beam as the charged particle beam, but it will be recognized that the beam used is not limited to an electron beam but other types of beam such as an ion beam can be used.

As described above, according to the charged particle beam exposure apparatus of the present invention, even if there is a variation in the exposure processing time among the columns due to manufacturing variations, perfect synchronization of control can be achieved for all the columns, and the same pattern can thus be projected for exposure simultaneously in all the columns. This achieves proper exposure in all the columns, achieving increased throughput.

Summarizing the advantageous effects of the invention, explained above, the invention provides a charged particle beam exposure apparatus having a plurality of columns, each containing deflection/scanning means for deflecting and scanning a charged particle beam across a sample for exposure, and writing a pattern on the sample by appropriately operating the deflection/scanning means in accordance with exposure pattern data, the apparatus comprising: a clock generator for generating an operation processing clock with which the entire charged particle beam exposure apparatus is operated; pattern data correction controllers, one for each column, each controller having a correction operation processing block for performing correction operation processing on the exposure pattern data according to the characteristics of its corresponding column in response to the operation processing clock and for supplying the resulting correction data to the deflection/scanning means contained in the corresponding column, and a data processing block for computing an operation processing time corresponding to an exposure processing cycle, required in the corresponding column, from data indicating a per-shot exposure time, settling waiting time, and exposure time correction value generated based on the correction operation processing; and a maximum value detector for detecting a maximum value from among the operation processing times computed by the data processing blocks in the respective pattern data correction controllers, and wherein the clock generator generates the operation processing clock based on the operation processing time of the maximum value detected by the maximum value detector.

In the above charged particle beam exposure apparatus, the data processing block in each of the pattern data correction controllers includes a multiplier circuit for multiplying the data indicating the exposure time by the data indicating the exposure time correction value, and an adder circuit for adding the output data of the multiplier circuit to the data indicating the settling waiting time and for supplying data representing the result of the addition to the maximum value detector as the data representing the operation processing time.

In the above charged particle beam exposure apparatus, the data processing block in each of the pattern data correction controllers further includes a subtractor circuit for subtracting the data representing the result of the multiplication from data representing the operation processing time of the maximum value detected by the maximum value detector and for supplying data representing the result of the subtraction to the clock generator as data indicating a blanking time for the corresponding column, and the clock generator generates a blanking signal for supply to the corresponding column, based on the data indicating the blanking time supplied from the data processing block.

In the above charged particle beam exposure apparatus, when each of the columns contains, as the deflection/scanning means, a mask deflector for deflecting the charged particle beam at a mask having an opening pattern formed therein for shaping the charged particle beam into a desired cross-sectional shape and a sub deflector for deflecting, over a small deflection range, the charged particle beam projected on the sample for exposure, the data indicating the settling waiting time includes first data indicating the settling waiting time of the mask deflector and second data indicating the settling waiting time of the sub deflector.

In the above charged particle beam exposure apparatus, the data processing block in each of the pattern data correction controllers further includes a comparison/selection circuit for comparing the first and second data by size and for selecting the data of the larger size for output to the adder circuit as the data indicating the settling waiting time.

What is claimed is:

1. A charged particle beam exposure apparatus having a plurality of columns, each containing deflection/scanning means for deflecting and scanning a charged particle beam across a sample for exposure, and writing a pattern on the sample by appropriately operating the deflection/scanning means in accordance with exposure pattern data, the apparatus comprising:

a clock generator for generating an operation processing clock with which the entire charged particle beam exposure apparatus is operated;

pattern data correction controllers, one for each of the plurality of columns, each pattern data controller having:

a correction operation processing block for performing correction operation processing on the exposure pattern data according to the characteristics of its corresponding column in response to the operation processing clock and for supplying the resulting correction data to the deflection/scanning means contained in the corresponding column, and a data processing block for computing an operation processing cycle, required in the corresponding column, from data indicating a per-shot exposure time, settling waiting time, and exposure time correction value generated based on the correction operation processing, wherein the data processing block in each of the pattern data correction controllers includes:

a multiplier circuit for multiplying the data indicating the exposure time by the data indicating the exposure time correction value, and an adder circuit for adding the output data of the multiplier circuit to the data indicating the settling waiting time and for supplying data representing the result of the addition to the maximum value detector as the data representing the operation processing time; and a maximum value detector for detecting a maximum value from among the operation processing times computed by the data processing blocks in the respective pattern data correction controllers, wherein the clock generator generates the operation processing clock based on the operation processing time of the maximum value detected by the maximum value detector.

2. A charged particle beam exposure apparatus as claimed in claim 1, wherein the data processing block in each of the pattern data correction controllers further includes a subtractor circuit for subtracting the data representing the result of the multiplication from data representing the operation processing time of the maximum value detected by the maximum value detector, and supplying data representing the result of the subtraction to the clock generator as data indicating a blanking time for the corresponding column, wherein the clock generator generates a blanking signal which is supplied to the corresponding column, based on the data indicating the blanking time supplied from the data processing block.

3. A charged particle beam exposure apparatus as claimed in claim 2, wherein the deflection/scanning means, includes:

a mask deflector for deflecting the charged particle beam at a mask having an opening pattern formed therein for shaping the charged particle beam into a desired cross-sectional shape, and a sub deflector for deflecting over a small deflection range the charged particle beam projected on the sample for exposure, the data indicating the settling waiting time including:
first data indicating the settling waiting time of the mask deflector, and
second data indicating the settling waiting time of the sub deflector.

4. A charged particle beam exposure apparatus as claimed in claim 3, wherein the data processing block in each of the pattern data correction controllers further includes a comparison/selection circuit for comparing the first and second data by size and for selecting the data of the larger size for output to the adder circuit as the data indicating the settling waiting time.

* * * * *